(12) United States Patent
Sridar et al.

(10) Patent No.: US 7,883,973 B2
(45) Date of Patent: Feb. 8, 2011

(54) METHOD OF FORMING SEMICONDUCTOR WELLS

(75) Inventors: Seetharaman Sridar, Richardson, TX (US); Marie Denison, Plano, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 12/335,756

(22) Filed: Dec. 16, 2008

(65) Prior Publication Data

US 2010/0148125 A1 Jun. 17, 2010

(51) Int. Cl.
*H01L 21/336* (2006.01)

(52) U.S. Cl. ............... 438/286; 438/549; 438/552; 257/E21.474

(58) Field of Classification Search ............... 438/135, 438/286, 529, 552, 923; 257/E21.473, E21.474
See application file for complete search history.

(56) References Cited

U.S. PATENT DOCUMENTS

| 6,406,974 B1 * | 6/2002 | Wu et al. ............... 438/420 |
| 6,716,709 B1 * | 4/2004 | Springer et al. ......... 438/301 |

* cited by examiner

*Primary Examiner*—Chandra Chaudhari
(74) *Attorney, Agent, or Firm*—Warren L. Franz; Wade J. Brady, III; Frederick J. Telecky, Jr.

(57) ABSTRACT

A method is provided of forming a semiconductor device. A substrate is provided having a dielectric layer formed thereover. The dielectric layer covers a protected region of the substrate, and has a first opening exposing a first unprotected region of the substrate. A first dopant is implanted into the first unprotected region through the first opening in the dielectric layer, and into the protected region through the dielectric layer.

14 Claims, 4 Drawing Sheets

METHOD OF FORMING SEMICONDUCTOR WELLS

TECHNICAL FIELD

This application is directed, in general, to a method of forming a semiconductor device, and, more specifically, to a method of forming doped wells.

BACKGROUND

A semiconductor device typically includes doped regions with different doping profiles, e.g., different dopant species, concentration and depth. Generally, each doped region is associated with a mask level of the semiconductor process flow. Conversely, typically a mask level is associated with a single corresponding doped region of the device.

SUMMARY

One aspect provides a method of forming a semiconductor device. A substrate is provided that has a dielectric layer formed thereover. The dielectric layer covers a protected region of the substrate, and has a first opening exposing a first unprotected region of the substrate. A first dopant is implanted into the first unprotected region through the first opening and into the protected region through the dielectric layer.

Another aspect provides a semiconductor device. The semiconductor device includes a first doped region and a second doped region. The first doped region is formed by a process including implanting a first dopant through a dielectric layer over a protected region of the substrate. The second doped region is formed by a process that includes implanting a second dopant through an opening in the dielectric layer into a first unprotected region of the substrate.

Another aspect provides a method of forming a semiconductor device. The method includes patterning a resist layer over a dielectric layer formed on a substrate. Exposed portions of the dielectric layer are removed. A first dopant is implanted into a first and a second unprotected portion of the substrate through openings in the dielectric layer. The implanting results in a first and a second doped region. A resist layer over the dielectric layer is patterned, exposing the second doped region and a portion of the dielectric layer, but leaving a remaining portion of the resist layer over the first doped region. A second dopant is implanted into the second doped region through an opening in the dielectric layer. A third dopant is implanted into the second doped region through the opening, and into the substrate through the exposed portion of the dielectric layer, resulting in a third doped region.

BRIEF DESCRIPTION

Reference is now made to the following descriptions taken in conjunction with the accompanying drawings, in which:

FIG. 9 illustrates a semiconductor device having three doped regions with different doping profiles.

DETAILED DESCRIPTION

The present disclosure includes the recognition that a number of doped regions of a semiconductor device may be formed using a fewer number of mask levels. Where an otherwise conventional semiconductor process flow is modified according to the principles of the disclosure, a fewer number of mask levels is needed, resulting in reduced fabrication cost and greater process throughput.

In the figures herein, a figure element retains its initial designation in later figures where there is little or no change to that element from an earlier figure. The thickness shown for the various layers is for illustration purposes, and is not intended to limit the disclosure to any particular thickness of the layers, unless otherwise stated.

Figure 1:
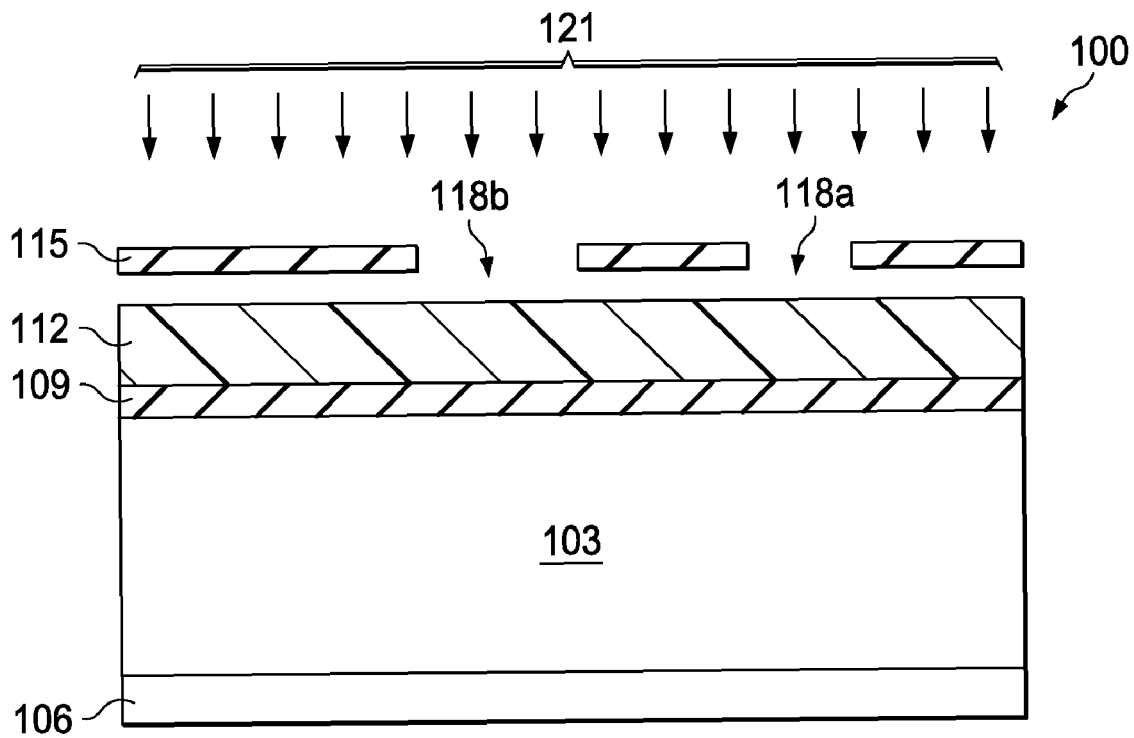
FIGS. 1-5, 7 and 9 illustrate various stages of formation of a semiconductor device.

FIG. 1 illustrates a semiconductor device 100 at an early stage of a process flow is provided. Herein, "provided" means that a device, substrate, structural element, etc., may be manufactured by the individual or business entity performing the disclosed methods, or obtained thereby from a source other than the individual or entity, including another individual or business entity. The device 100 includes a semiconductor substrate 103. The substrate 103 may be any conventional or future developed semiconductor substrate, including, e.g., silicon, germanium, GaAs, and semiconductor-on-insulator. The substrate 103 may be n-doped or p-doped as determined by the characteristics of the device 100 being formed. The substrate 103 may overlie a buried layer 106 of an opposite doping polarity. Thus, e.g., if the substrate 103 is a p-doped layer, the buried layer 106 may be n-doped.

A dielectric layer 109 overlies the substrate 103. The dielectric layer may act as a hardmask in later processing steps, and may be, e.g., SiN, $SiO_2$, SiON or other material appropriate to the nature of the substrate 103. As discussed further below, the choice of material of the dielectric layer 109 may be based on the barrier characteristics thereof with respect to a particular implanted dopant. A photosensitive layer 112, referred to hereinafter without limitation as a photoresist, is formed over the dielectric layer 109. A mask 115 is located over the photoresist 112. The mask 115 includes openings 118a, 118b through which the photoresist 112 may be exposed to an exposure process 121. The exposure process 121 and photoresist 112 are illustrated as a positive resist/exposure system, e.g. Alternatively, a negative resist/exposure system may be used.

Figure 2:
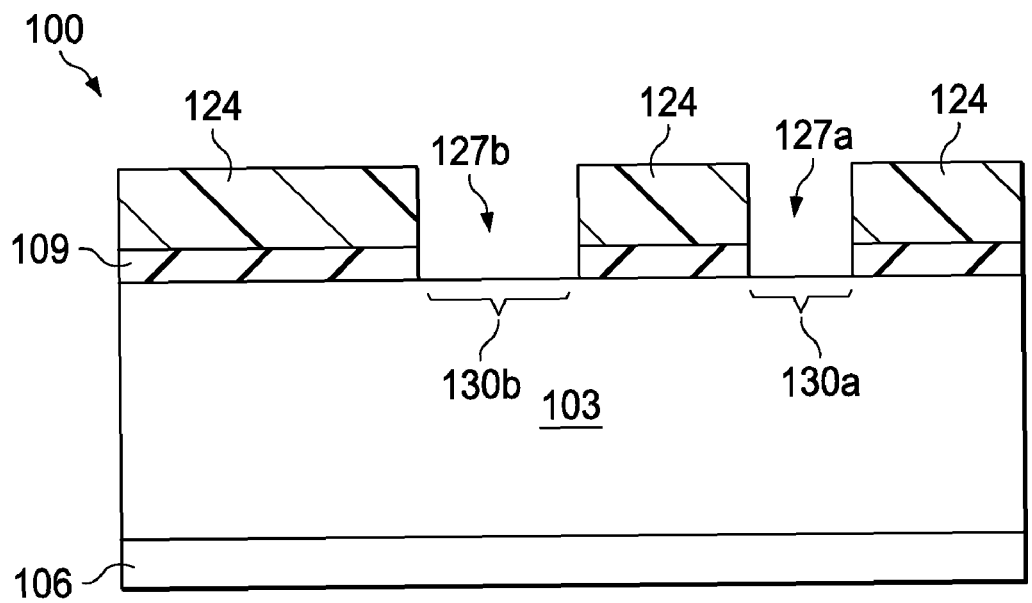

FIG. 2 illustrates the device 100 after the photoresist 112 has been developed to remove exposed portions thereof and leave remaining portions 124. The developing produces a first opening 127a and a second opening 127b in the dielectric layer 109. An etch process has been used to remove portions of the dielectric layer 109 exposed by the openings 127a, 127b. The removing exposes a first unprotected region 130a and a second unprotected region 130b of the substrate 103.

Figure 3:
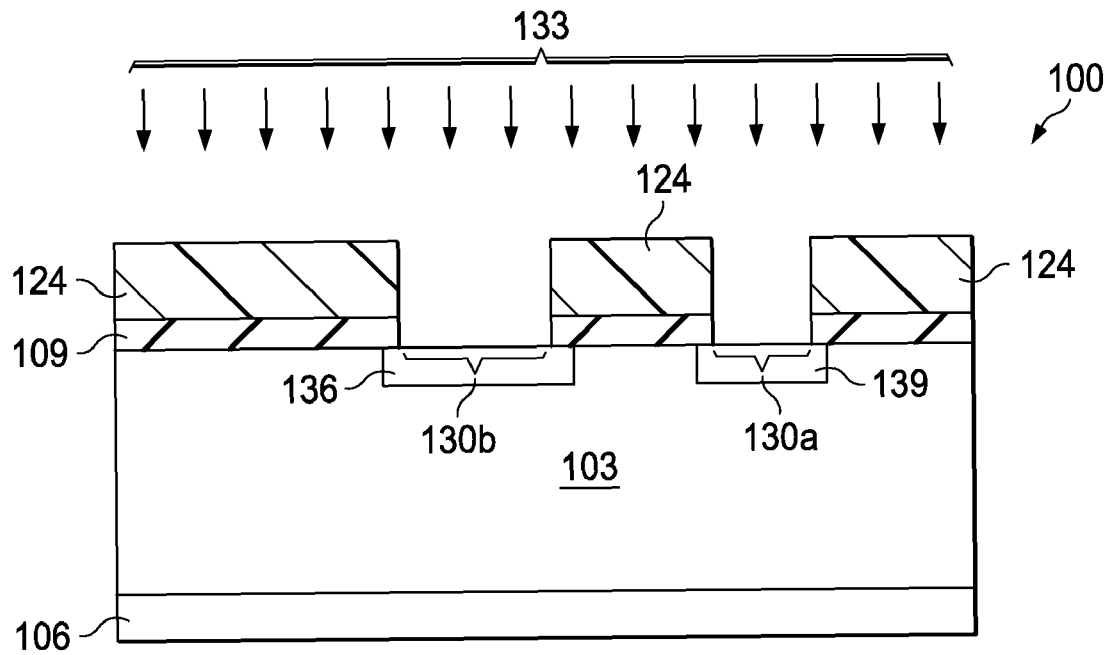

FIG. 3 illustrates the device 100 during implantation of a dopant by an implant process 133 into the first and second unprotected regions 130a, 130b. In embodiments in which the substrate 103 is a p-type substrate, the dopant may be an n-type dopant such as, e.g. phosphorous. In embodiments in which the substrate 103 is an n-type substrate, the dopant may be a p-type dopant such as, e.g. boron. The dopant may be implanted with implant conditions typical for, e.g., an n-drain region in a p-type substrate. For example, about 1-2 E13 $cm^2$ phosphorous may be implanted with an implant energy of about 160 keV. The implanting forms a first doped region 136 and a second doped region 139.

Figure 4:
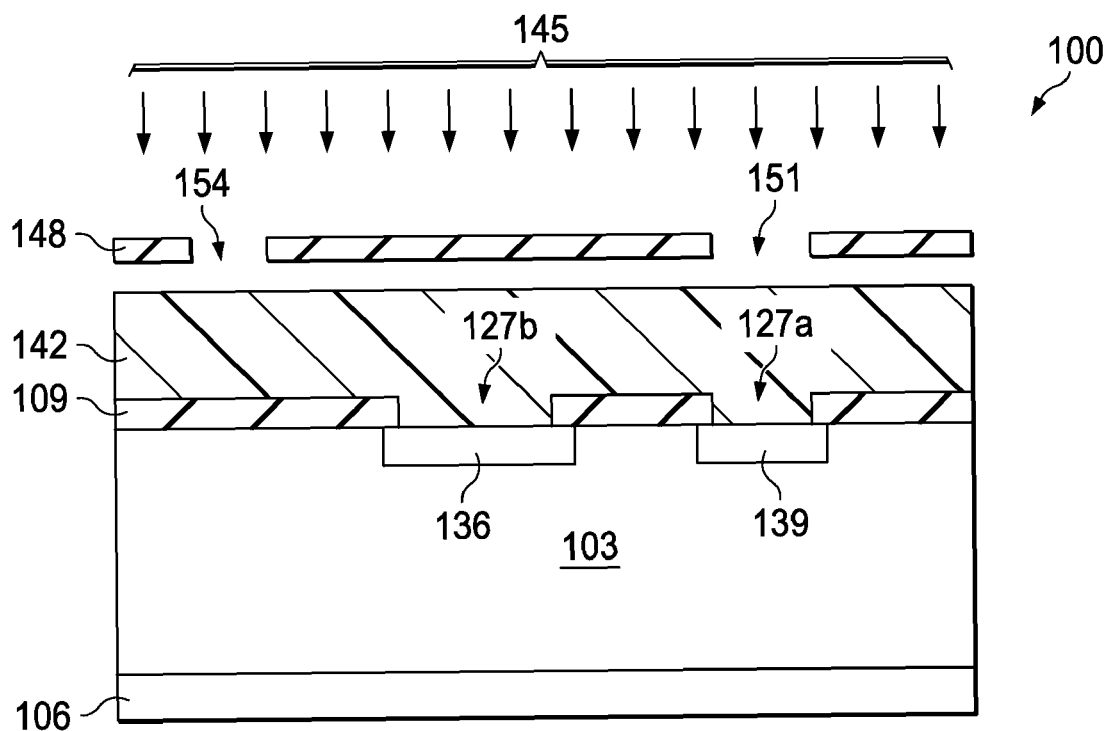

In FIG. 4, the remaining portions 124 of the photoresist 112 have been removed, and a second photoresist layer 142 has been formed over the substrate 103. An exposure process 145 exposes the photoresist layer 142 using a mask 148. The mask 148 is configured to include an opening 151 generally coextensive with the first opening 127*a*. An opening 154 may be located over an uninterrupted portion of the dielectric layer 109. Again, a negative exposure/photoresist system may be used as an alternative to the illustrated positive system.

Figure 5:
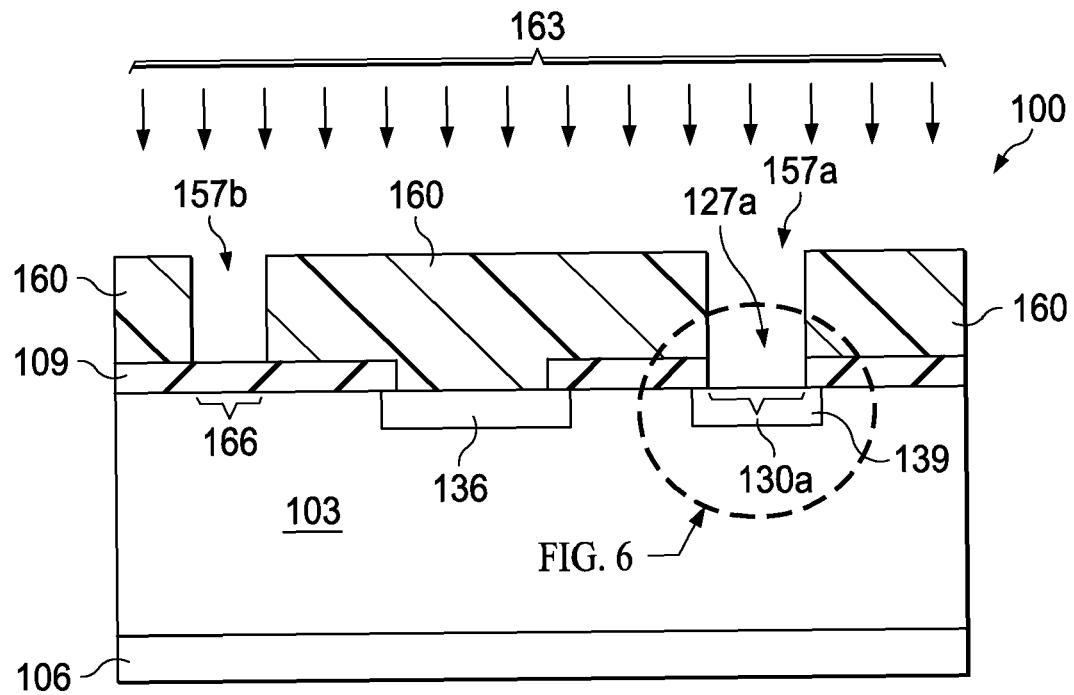

FIG. 5 illustrates the device 100 after developing the photoresist layer 142 to form openings 157*a*, 157*b* therein and remaining portions 160. An implant process 163 implants a dopant into the first unprotected region 130*a* through the first opening 127*a*. A protected region 166 of the substrate 103 is protected from the implant process 163 by virtue of the dielectric layer 109.

The implant process 163 and the dielectric layer 109 are configured such that the dopant is implanted into the first unprotected region 130*a* but not into the protected region 166. The thickness of the dielectric layer 109 may be made thick enough to prevent essentially all the dopant from reaching the protected region 166. The thickness may also depend on the material used for the dielectric layer 109. For example, in some cases a SiN layer may block a particular dopant species more effectively than an $SiO_2$ layer of the same thickness. Thus, a greater thickness of an $SiO_2$ layer may be needed to block the dopant than would be necessary were the dielectric layer 109 to be formed from SiN. The choice of material may also be made in view of selectivity of a removal process to other structures formed over the substrate 103.

In one aspect the implant process 163 uses at implant energy low enough, and/or the dielectric layer 109 is thick enough, that a majority of dopant atoms are stopped by the dielectric layer 109 over the protected region 166. In some embodiments, less than about 10% of dopant atoms entering the dielectric layer 109 continue into the protected region 166. In some embodiments, the dielectric layer 109 is thick enough, or the implant energy of the implant process 163 low enough, that less than 1% of the dopant atoms continue into the protected region 166.

In a nonlimiting example, the implant process 163 is configured to implant an n-type dopant such as phosphorous with an energy in the range from about 10 keV to about 500 keV. A dose of about $5E15\ cm^2$ may be used in some embodiments. In some embodiments, a SiN dielectric layer may be used with a thickness of about 50 nm, e.g. A greater thickness may be used where needed to effectively block a dopant implanted with a higher energy. In another embodiment, $SiO_2$ may be used with a thickness of about 100 nm, e.g. Those skilled in the pertinent art may determine other implant conditions and dielectric layer types consistent with a particular design of the device 100.

Figure 6:
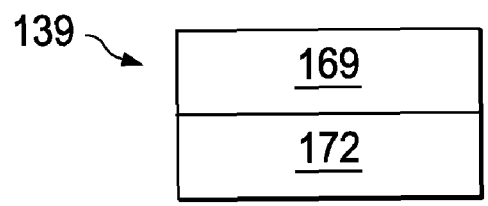
FIGS. 6 and 8 illustrate detail views of a doped region implanted by multiple implant processes.

The implant process 163 delivers the dopant to the first unprotected region 130*a*, thus providing additional doping to the second doped region 139. FIG. 6 illustrates an embodiment of the relationship between portions of the second doped region 139. The parameters of the implant process 133 and the implant process 163 are typically different, leading to portions 169, 172 having different doping profiles. Herein, a doping profile is a dopant species, concentration or depth of a doped region. Thus, the portion 169 and the portion 172 may in general have a different dopant species, concentration or depth. Specific values of these parameters will typically be determined by the specific requirements of a design of the device 100.

Figure 7:
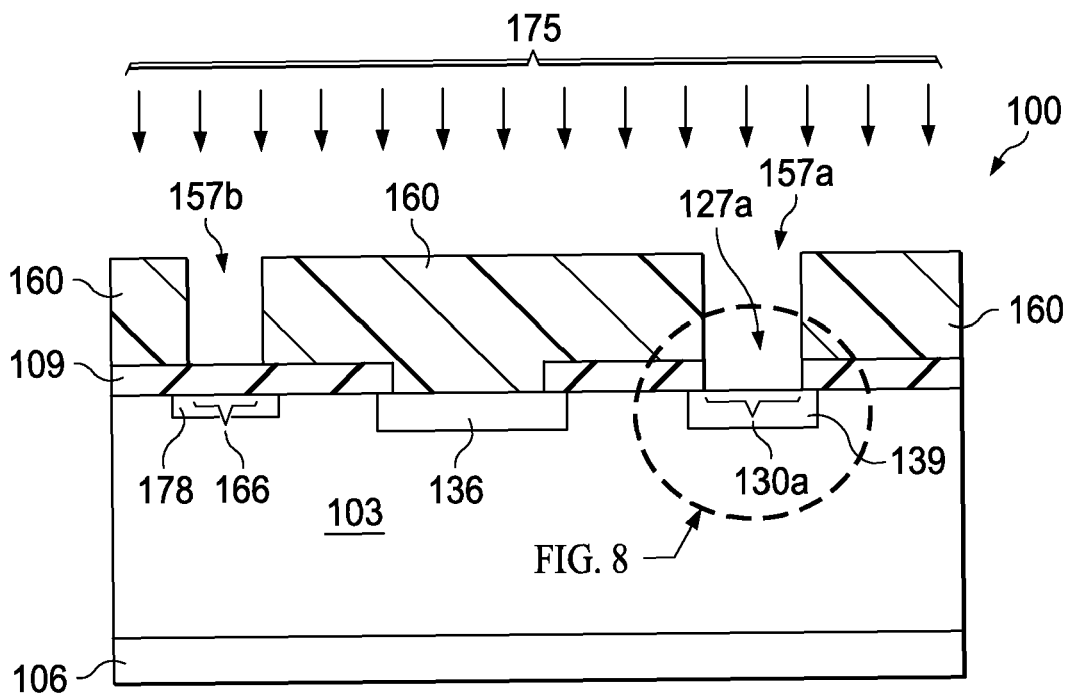

FIG. 7 illustrates the device 100 during implantation by an implant process 175. The implant process 175 may be configured to implant a dopant into the first unprotected region 130*a* and into the protected region 166 through the dielectric layer 109. The implanting may alter the second doped region 139, and may create a third doped region 178. In one aspect, the implant process 175 is configured to provide a dopant species with a higher energy than the implant process 163. In some cases, the dopant species is an n-type dopant. In some embodiments, the implant process 175 is configured to dope the third doped region 178 at a concentration suitable for, e.g., an n-well of a transistor. In some embodiments, the implant energy may be in a range from about 100 keV to about 300 keV. In another aspect, the dose provided by the implant process 175 may be in a range from about $5E15\ atoms/cm^2$ to about $1E16\ atoms/cm^2$. In a nonlimiting example, the implant process 175 may provide an n-type dopant such as phosphorous with an energy of about 300 keV and a dose of about $1E13\ atoms/cm^2$. In some cases, such as when a p-well is desired, e.g., the dopant species is a p-type dopant, such as boron.

The dopant species provided by the implant processes 133, 163, 175 may be a same atomic species, but need not be. In some embodiments, e.g., a p-type dopant may be provided by one of the processes 133, 163, 175, while an n-type dopant may be provided by another of the processes 133, 163, 175. In some cases, dopant species provided by the processes 133, 163, 175 may be of a same polarity, e.g., n-type, but be different atomic types, e.g., phosphorous and arsenic.

In one embodiment, for example, the implant process 133 may provide a p-type dopant, and the implant process 175 may provide an n-type dopant. In some embodiments, the implant process 163 may be an n-type dopant to provide a deep-n well region below the first unprotected region 130*a*, while the implant process 175 may provide a p-type dopant to provide a p-well below the protected region 166. In another embodiment, the implant process 133 may provide a p-type dopant to the first doped region 136 to form, e.g., a p-drain at a later step, while the implant processes 163, 175 may provide n-type dopants to the second and third doped regions 139, 178, respectively.

Figure 8:
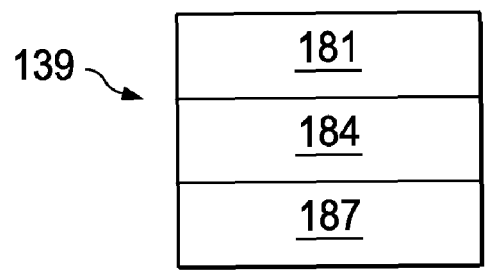

FIG. 8 illustrates an embodiment of the relationship between portions of the second doped region 139 after the implant process 175. The parameters of the implant process 175 will in general be different from the parameters of the implant processes 133, 163. Thus, the second doped region 139 may in general have three portions 181, 184, 187 having different doping profiles. The doping profiles of the portions 169, 172 may be altered by the implant process 175. One of the portions 181, 184, 187 may have a doping profile designed to provide a deep doped region after annealing and activation by a later thermal process. In some cases, the portions 181, 184, 187 may have different dopant species. In one embodiment, one of the portions 181, 184, 187 has predominantly a p-type dopant such as boron, while the other of the portions 181, 184, 187 has predominantly an n-type dopant such as, e.g., phosphorous. Such may the case, e.g., when the substrate 103 is an n-type substrate and a deep p-type region is desired to make contact with an underlying p-type layer.

Figure 9:
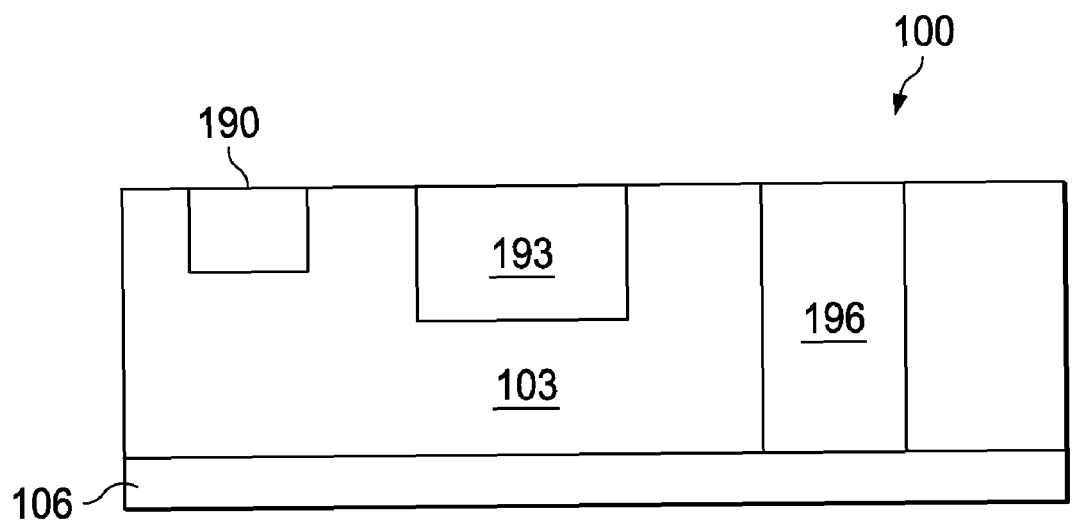

FIG. 9 illustrates the device 100 after a thermal process that may be designed to anneal and activate the dopants provided by the implant processes 133, 163, 175. In the illustrated embodiment, presented without limitation, the device 100 is a power MOSFET device with a substrate 103 being a p-type substrate. The implant processes 133, 163, 175 are configured to provide an n-well 190 (shallow well region), an n-drain 193 (source/drain region) and a deep-n region 196 (deep well region) that makes contact with the buried layer 106.

By virtue of the preceding process steps, the n-well 190, n-drain 193 and deep-n region 196 are formed using only two mask levels. In particular, the exposure process 121 and the exposure process 145 are configured with the cooperation of the masks 115, 148 and the implant processes 133, 163, 175 to provide three regions having a different doping profile, which may include, e.g., dopant species, concentration and depth. In contrast, conventional semiconductor processing typically requires a mask level for each distinct well type. The elimination of a mask level from a semiconductor process flow provides reduced cost and increased throughput of manufacturing line relative to conventional process flows.

Those skilled in the art to which this application relates will appreciate that other and further additions, deletions, substitutions and modifications may be made to the described embodiments.

What is claimed is:

1. A method of forming a semiconductor device, comprising:
   patterning a first mask layer over a dielectric layer formed on a substrate;
   removing exposed portions of said dielectric layer;
   implanting a first dopant into a first and a second unprotected region of said substrate through openings in said dielectric layer, resulting in a first and a second doped region;
   patterning a second mask layer over said dielectric layer, exposing said second doped region and a portion of said dielectric layer, but leaving a remaining portion of said second mask layer over said first doped region;
   implanting a second dopant into said second doped region through an opening in said dielectric layer; and
   implanting a third dopant into said second doped region through said opening, and into said substrate through said exposed portion of said dielectric layer, resulting in a third doped region.

2. The method recited in claim 1, wherein said first and second mask layers are photoresist layers; and said dielectric layer is a nitride layer.

3. The method recited in claim 1, further comprising diffusing said first, second and third dopants in said substrate, wherein said first, second and third doped regions have different doping profiles.

4. The method recited in claim 1, wherein said second dopant is stopped by said exposed portion of said dielectric layer.

5. The method recited in claim 1, wherein said first dopant and said third dopant are different dopant species.

6. The method recited in claim 1, wherein said second dopant is implanted with a high dose, low energy implant profile, and said third dopant is implanted with a low dose, high energy implant profile.

7. The method recited in claim 1, further comprising diffusing said first, second and third dopants in said substrate, resulting in said first, second and third doped regions having different dopant profiles.

8. A method of forming a semiconductor device, comprising:
   providing a semiconductor substrate;
   forming a nitride hardmask layer over the substrate;
   forming a first photoresist layer over the dielectric layer;
   patterning the first photoresist layer with first and second openings;
   etching the nitride hardmask layer through the first and second openings to expose first and second regions of the substrate;
   performing a first dopant implant at a first implant energy through the first and second openings respectively into the first and second regions;
   forming a second photoresist layer over the nitride hardmask layer;
   patterning the second photoresist layer with third and fourth openings, the third opening being generally coextensive with and exposing the second region, and the fourth opening being located over a third region of the substrate covered by an unetched portion of the nitride hardmask layer; and
   performing a second dopant implant at a second implant energy greater than the first implant energy, through the third opening into the second region and through the unetched portion into the third region;
   whereby the first and second dopant implants implant the first, second and third regions with respective different doping profiles of same n or p conductivity type.

9. The method of claim 8, wherein the first and second dopant implants implant the first, second and third regions with doping profiles respectively defining an n-source or drain region, a deep-n region, and an n-well.

10. The method of claim 9, wherein the first dopant implant comprises an implant of phosphorous implanted at an implant energy of about 160 keV; and the second dopant implant comprises an implant of phosphorous implanted at an implant energy of about 300 keV.

11. The method of claim 10, wherein the first and second dopant implants implant the phosphorous at a dose of about 1-2E13 or about 1E13 atoms/cm$^2$.

12. The method of claim 8, further comprising performing a third dopant implant at a third implant energy through the third opening into the second region, to provide additional doping into the second region.

13. The method of claim 12, wherein the first and second dopant implants implant the first, second and third regions with doping profiles respectively defining a source or drain region, a deep well region, and a shallow well region.

14. The method of claim 13, wherein the device is a power MOSFET device.

* * * * *